(12) United States Patent
Ichimura et al.

(10) Patent No.: US 8,054,072 B2
(45) Date of Patent: Nov. 8, 2011

(54) QUANTUM COMPUTER AND QUANTUM COMPUTING METHOD

(75) Inventors: Kouichi Ichimura, Yokohama (JP); Hayato Goto, Kawasaki (JP)

(73) Assignee: Kabushiki Kaisha Toshiba, Tokyo (JP)

(*) Notice: Subject to any disclaimer, the term of this patent is extended or adjusted under 35 U.S.C. 154(b) by 254 days.

(21) Appl. No.: 12/543,828

(22) Filed: Aug. 19, 2009

(65) Prior Publication Data

US 2010/0044600 A1 Feb. 25, 2010

(30) Foreign Application Priority Data

Aug. 20, 2008 (JP) ................. 2008-211905

(51) Int. Cl.
*G02B 27/42* (2006.01)
*H01L 29/15* (2006.01)

(52) U.S. Cl. ......... 324/300; 712/19; 714/746; 250/550; 359/107

(58) Field of Classification Search .......... 324/304
See application file for complete search history.

(56) References Cited

U.S. PATENT DOCUMENTS

| | | | | |
|---|---|---|---|---|
| 5,000,540 | A * | 3/1991 | Nakamura | 385/12 |
| 6,101,203 | A * | 8/2000 | Yamamoto et al. | 372/39 |
| 2005/0167772 | A1 * | 8/2005 | Stoneham et al. | 257/432 |
| 2008/0089696 | A1 * | 4/2008 | Furuta | 398/175 |

OTHER PUBLICATIONS

B. E. Kane, "A silicon-based nuclear spin quantum computer", Nature, vol. 393, May 14, 1998, pp. 133-137.*

Bertaina et al, "Rare-earth solid-state qubits", Nature Nanotechnology, vol. 2, Jan. 2007, pp. 3942.*

Ohlsson et al, "Quantum computer hardware based on rare-earth-ion-doped inorganic crystals", Optics Communications, vol. 21, Jan. 1, 2002, pp. 71-77.*

Kouichi Ichimura, "A Simple Frequency-Domain Quantum Computer with Ions in a Crystal Coupled to a Cavity Mode", N.H Elsevier, Optics Communications 196, Sep. 1, 2001, pp. 119-125, reference previously filed submitting Statement of Relevance only.

Lars Rippe, et al, Experimental Demonstration of Efficient and Selective Population Transfer and Qubit Distillation in a Rare-Earth-Metal-Ion-Droped Crystal, The American Physical Society, Physical Review A 71, 062328, 2005, pp. 1-12, reference previously filed submitting Statement of Relevance only.

Seth Lloyd, "A Potentially Realizable Quantum Computer", Science, vol. 261, Sep. 17, 1993, pp. 1569-1571, reference previously filed submitting Statement of Relevance only.

* cited by examiner

*Primary Examiner* — Patrick Assouad
*Assistant Examiner* — Vincent P Spinella Mamo
(74) *Attorney, Agent, or Firm* — Oblon, Spivak, McClelland, Maier & Neustadt, L.L.P.

(57) ABSTRACT

A quantum computer includes a unit including thin films A, B and C each containing a physical-system group A, B and C formed of physical systems A, B and C, the films A, B and C being alternately stacked in an order of A, B, C, A, . . . , each of the systems A, B and C having three-different-energy states $|0\rangle_x, |1\rangle_x, |e\rangle_x$, a quantum bit being expressed by a quantum-mechanical-superposition state of $|0\rangle_x$ and $|1\rangle_x$, a light source generating light beams having angular frequencies $\omega_{A(E),ye,g}, \omega_{A(E),ye,e}, \omega_{x,ye,gg}, \omega_{x,ye,ge}, \omega_{x,ye,eg}$ and $\omega_{x,ye,ee}$, $\omega_{A(E),ye,g}$, a unit controlling frequencies and intensities of the beams, and a unit measuring intensity of light emitted from or transmitted through physical-system group A(E) contained in a lowest one of the thin films A to detect a quantum state of the group A(E).

10 Claims, 6 Drawing Sheets

Types of physical systems and arrangement order thereof

| | D(E) | E | F | D | E | F | D | E | F | D | E | F | ... |
|---|---|---|---|---|---|---|---|---|---|---|---|---|---|
| $\omega^D_{01}$ | 0 | 1 | 0 | 0 | 1 | 1 | 1 | 0 | 1 | 0 | 0 | 0 | ... |
| $\omega^D_{11}$ | 0 | 1 | 0 | 1 | 1 | 1 | 1 | 0 | 1 | 0 | 0 | 0 | ... |
| $\omega^E_{10}$ | 0 | 1 | 0 | 1 | 1 | 1 | 1 | 0 | 1 | 0 | 0 | 0 | ... |
| $\omega^E_{11}$ | 0 | 1 | 0 | 1 | 1 | 1 | 1 | 0 | 1 | 0 | 0 | 0 | ... |
| $\omega^D_{01}$ | 0 | 1 | 0 | 1 | 0 | 1 | 1 | 1 | 1 | 0 | 0 | 0 | ... |
| $\omega^D_{11}$ | 0 | 1 | 0 | 1 | 0 | 1 | 1 | 1 | 1 | 0 | 0 | 0 | ... |
| | 0 | 1 | 0 | 1 | 0 | 1 | 0 | 1 | 1 | 0 | 0 | 0 | ... |

Values of bits

Angular frequencies of $\pi$ pulses applied

Order of $\pi$ pulses applied

After irradiation of $\pi$ pulses, the bit values of D and E are exchanged for each other, and those of F and D(E) do not change.

FIG. 3

Types of physical systems and arrangement order thereof

| | F | D | E | F | D | E | F | D | E | E | D | E | F |
|---|---|---|---|---|---|---|---|---|---|---|---|---|---|
| $\omega^D_{01}$ | .. 0 | 1 | 1 | 0 | 1 | 0 | 1 | 1 | 0 | 0 | 1 | 1 | 1 .. |
| $\omega^D_{11}$ | .. 0 | 0 | 1 | 0 | 1 | 0 | 1 | 1 | 0 | 0 | 0 | 1 | 1 .. |
| $\omega^E_{11}$ | .. 0 | 0 | 1 | 0 | 1 | 0 | 1 | 1 | 0 | 0 | 0 | 1 | 1 .. |
| $\omega^D_{01}$ | .. 0 | 0 | 1 | 0 | 1 | 1 | 1 | 1 | 0 | 0 | 0 | 1 | 1 .. |
| $\omega^D_{11}$ | .. 0 | 1 | 1 | 0 | 0 | 1 | 1 | 1 | 0 | 0 | 1 | 1 | 1 .. |
| | .. 0 | 1 | 1 | 0 | 0 | 1 | 1 | 1 | 0 | 0 | 1 | 1 | 1 .. |

Values of bits

Angular frequencies of $\pi$ pulses applied

Order of $\pi$ pulses applied

Assuming that a series of D, E and F are regarded as one group, after irradiation of $\pi$ pulses, the bit values of D and E are exchanged for each other if the bit value of F is 1, and those of D and E do not change if the bit value of F is 0 (Fredkin gate).

FIG. 4

Types of physical systems and arrangement order thereof

| | A | B | C | A | B | C | A | |
|---|---|---|---|---|---|---|---|---|
| $\omega_{C,1e,gg}$ ... | 0 | 1 | 0 | 0 | 1 | 1 | 1 | ... |
| $\omega_{C,1e,ge}$ ... | 0 | 1 | 0 | 0 | 1 | e | 1 | ... |
| $\omega_{C,1e,gg}$ ... | 0 | 1 | 0 | 0 | 1 | e | 1 | ... |
| $\omega_{C,1e,ee}$ ... | 0 | 1 | 0 | 0 | 1 | e | 1 | ... |
| $\omega_{B,1e,gg}$ ... | 0 | 1 | 0 | 0 | 1 | e | 1 | ... |
| $\omega_{B,1e,ge}$ ... | 0 | e | 0 | 0 | 1 | e | 1 | ... |
| $\omega_{B,1e,eg}$ ... | 0 | e | 0 | 0 | e | e | 1 | ... |
| $\omega_{B,1e,ee}$ ... | 0 | e | 0 | 0 | e | e | 1 | ... |
| $\omega_{A,0e,ge}$ ... |   | e | 0 | e | e | e | 1 | ... |
| $\omega_{A,1e,ge}$ ... |   | e | 0 | 1 | e | e | 1 | ... |
| $\omega_{A,0e,ge}$ ... |   | e | 0 | 1 | e | e | 1 | ... |
| $\omega_{C,1e,gg}$ ... |   | e | 0 | 1 | e | e | 1 | ... |
| $\omega_{C,1e,ge}$ ... |   | e | 0 | 1 | e | e | 1 | ... |
| $\omega_{C,1e,gg}$ ... |   | e | 0 | 1 | e | 1 | 1 | ... |
| $\omega_{C,1e,ee}$ ... |   | e | 0 | 1 | e | 1 | 1 | ... |
| $\omega_{B,1e,gg}$ ... |   |   | 0 | 1 | 1 | 1 | 1 | ... |
| $\omega_{B,1e,ge}$ ... |   |   | 0 | 1 | 1 | 1 | 1 | ... |
| $\omega_{B,1e,eg}$ ... |   |   | 0 | 1 | 1 | 1 | 1 | ... |
| $\omega_{B,1e,ee}$ ... |   |   | 1 | 0 | 1 | 1 | 1 | ... |

Values of bits
Angular frequencies of $\pi$ pulses applied
Order of $\pi$ pulses applied After irradiation of $\pi$ pulses, the bit value of x = A is inverted and those of the other physical systems do not change, if those of x-1 and x+1 are 0 and 1, respectively.

FIG. 5

View taken from above

Sectional view of a central portion taken laterally

QUANTUM COMPUTER AND QUANTUM COMPUTING METHOD

CROSS-REFERENCE TO RELATED APPLICATIONS

This application is based upon and claims the benefit of priority from prior Japanese Patent Application No. 2008-211905, filed Aug. 20, 2008, the entire contents of which are incorporated herein by reference.

BACKGROUND OF THE INVENTION

1. Field of the Invention

The present invention relates to a quantum computer and method using physical systems in a thin film.

2. Description of the Related Art

The state of the nuclear spin of each rare earth metal ion in crystal has a coherence time (the time of holding a quantum mechanical superposition state) specifically long as a solid. This property is a most important one required for physical systems that realize, in a solid state, a quantum information processing device, such as a quantum computer, which expresses information using superposition of states of each physical system and executes information processing. Further, the state of the nuclear spin of each rare earth metal ion in crystal can be controlled and read, using light of low noise that has excellent controllability. Because of these properties, the state of the nuclear spin of each rare earth metal ion in crystal is extremely suitable for realization of a quantum information processing device in a solid state.

There is a method in which when using nuclear spins in crystal as quantum bits, the states of the nuclear spins of individual ions are used as quantum bits, and differences between the ions in transition angular frequencies unique to solids, which are distributed in inhomogeneous broadening and do not change with time (in the case of gases, the inhomogeneous broadening is based on the motion of individual atoms and molecules, and hence their transition angular frequencies vary momentarily because of changes in the quantities of their motion due to their collision), are utilized to adjust the frequency of light applied to the ions so as to individually operate the quantum bits. This method employs an optical resonator, and the individual quantum bits contained therein are made to resonate with a common resonator mode, therefore can be processed substantially completely in a frequency domain. Namely, when accessing individual quantum bits or coupling quantum bits, the positional relationship between the quantum bits in a real space is not so important, with the result that a quantum computer, which does not require strict microfabrication of, for example, electrodes, can be realized (see, for example, Opt. Commun. 196, 119 (2001)).

Another method has been proposed, in which differences in transition angular frequency between ions contained in crystal are utilized for accessing individual quantum bits, as in the above-described method, whereby strict processing of crystal and electrodes is not needed (see, for example, Phys. Rev. A, 71, 062328 (2005)). In this method, a group of ions having transition angular frequencies that fall within a certain range set in units of quantum bits is used as a single quantum bit. This structure aims to obtain a read signal of a higher level than in the case of using a single ion as a quantum bit. In this structure, the dipole-dipole interaction of ions is utilized for coupling quantum bits. Namely, the ion-ion interaction (dipole-dipole interaction) of ions providing a certain quantum bit, and ions providing another quantum bit and located adjacent to the first-mentioned ions, is utilized.

However, it is considered that in this method, if the number of quantum bits is increased, the number of ions providing one quantum bit is reduced and accordingly the level of the read signal is reduced. It is also considered that if the number of quantum bits is increased, the average distance between physical systems expressing two quantum bits is increased to thereby weaken the interaction for coupling. If only ions of higher interaction levels are selected, the number of ions providing one quantum bit is further reduced.

There is yet another method in which quantum bits are discriminated using differences in transition angular frequency between physical systems that provide the quantum bits.

In this method, three types of physical systems adjacent to each other which are interactive are arranged cyclically (see, for example, Science 261, 1569 (1993)). Physical systems of different types have different transition angular frequencies, and physical systems of the same type have the same transition angular frequency. When a light beam that resonates with the physical systems of one of the three types is applied to the entire physical systems, the physical systems of the one type are operated in parallel. This parallel operation is repeated while the frequency of the applied light beam is changed to change the type of physical systems to be operated. During executing the parallel operation, the physical system located at an end is operated independently of the other physical systems, and the fact that the transition angular frequency of a certain physical system changes in accordance with the quantum state of the physical system adjacent thereto is utilized, thereby executing reading and writing data.

Further, in this method, an atomic group (monomeric substance) forming a macromolecular chain is regarded as a physical system, and only two states, i.e., the excited state and ground state of the monomeric substance, are used as a quantum bit. Thus, there is no concrete description concerning a physical system that has a sufficiently long coherence time, and concerning a method necessary to use a system (such as a state of a nuclear spin) as a quantum bit.

As a method of realizing a practical quantum computer using a large number of quantum bits, it is desirable to use a method that satisfies the following conditions:

(1) Quantum bits have a sufficiently long coherence time;

(2) The method is advantageous in that, for example, it is not necessary to process crystal and/or form electrodes by strict microfabrication;

(3) A physical system group formed of a large number of physical systems can be used as a single quantum bit to obtain a read signal of high level; and (4) A sufficient scalability in the number of quantum bits is realized.

However, such a method as satisfies the above conditions is not known at present.

BRIEF SUMMARY OF THE INVENTION

According to an aspect of the invention, there is provided a quantum computer comprising: a laminated unit including a plurality of thin films A each containing a physical system group A formed of a plurality of physical systems A, a plurality of thin films B each containing a physical system group B formed of a plurality of physical systems B, and a plurality of thin films C each containing a physical system group C formed of a plurality of physical systems C, the thin films A, B and C being alternately stacked on each other with a thin film A positioned lowest, in an order of A, B, C, A, B, C, A, .

..., each of the physical systems A, B and C having three different energy states $|0>_x$, $|1>_x$, $|e>_x$ (suffix x indicating a state of each of physical systems x, and x representing A, B and C that represent types of the physical systems, the physical systems x providing physical system groups x), a quantum bit being expressed by a quantum mechanical superposition state of $|0>_x$ and $|1>_x$; a light source which generates a plurality of light beams having angular frequencies $\omega_{A(E), ye, g}$, $\omega_{A(E), ye, e}$, $\omega_{x, ye, gg}$, $\omega_{x, ye, ge}$, $\omega_{x, ye, eg}$ and $\omega_{x, ye, ee}$, and having spectral widths narrower than differences between the angular frequencies, and applies the light beams to the thin films, an angular frequency $\omega_{A(E), ye, g}$ being a $|y>_{A(E)}-|e>_{A(E)}$ (y=0, 1) transition angular frequency of one (physical system group A(E)) of the physical system groups A that is contained in a lowest one (thin film A(E)) of the thin films A, the $|Y>_{A(E)}-|e>_{A(E)}$ transition angular frequency being assumed when one of the physical system groups B that is contained in one of the thin films B that is located just above the thin film A(E) is in $|y'>_B$ (y'=0, 1), the angular frequency $\omega_{A(E), ye, e}$ being the $|y>_{A(E)}-|e>_{A(E)}$ transition angular frequency assumed when the one of physical system group B is in $|e>_B$, an angular frequency $\omega_{x, ye, gg}$ being a $|y>_x-|e>_x$ transition angular frequency of a first one of the physical system groups x which excludes the physical system group A(E), the $|y>_x-|e>_x$ transition angular frequency being assumed when a second one of the physical system groups x located just below the first one is in $|y>$ and a third one of the physical system groups x located just above the first one is in $|y>$, an angular frequency $\omega_{x, ye, ge}$ being the $|y>_x-|e>_x$ transition angular frequency of the first one assumed when the second one is in $|y>$ and the third one is in $|e>$, the angular frequency $\omega_{x, ye, eg}$ being the $|y>_x-|e>_x$ transition angular frequency of the first one assumed when the second one is in $|e>$ and the third one is in $|y'>$, the angular frequency $\omega_{x, ye, ee}$ being the $|y>_x-|e>x$ transition angular frequency of the first one assumed when the second one is in $|e>$ and the third one is in $|e>$; a control unit configured to control frequencies and intensities of the light beams; and a measuring unit configured to measure intensity of light emitted from or transmitted through the physical system group A(E) in the thin film A(E) to detect a quantum state of the physical system group A(E).

BRIEF DESCRIPTION OF THE SEVERAL VIEWS OF THE DRAWING

FIG. 3 is a view illustrating an example of an exchange operation between physical systems of designated types;

FIG. 4 is a view illustrating an example of a Fredkin gate operation between physical systems of designated types;

FIG. 5 is a view illustrating an example of an inverse operation between physical systems of designated types;

DETAILED DESCRIPTION OF THE INVENTION

A quantum computer and method according to an embodiment will be described in detail with reference to the accompanying drawings. In the embodiment and an example, like reference numbers denote like elements, and duplication of description will be omitted.

In the embodiment of the present invention, three types of thin films A, B and C, which contain three types of physical system groups A, B and C formed of three types of physical systems A, B and C, are stacked in the order of, for example, A, B, C, A, B, C, A, . . . . The physical systems A, B and C each have three states, and two of the three states which have relatively long coherence times are used as a quantum bit. Depending upon whether a physical system group contained in one thin film is in a state that expresses a quantum bit, the transmission angular frequency between a quantum-bit expressing state of a physical system group contained in another thin film adjacent to the one thin film, and the third state of this physical system group that does not express a quantum bit varies. This phenomenon is utilized in the embodiment of the present invention. Namely, light pulses having their frequencies and intensities adjusted are sequentially applied to the stacked thin films, thereby making it possible to impart a sufficiently long coherence time to quantum bits, making it unnecessary to achieve strict microfabrication, and also making it possible to produce a read signal of high level and to realize a sufficient scalability in the number of quantum bits.

Figure 1:
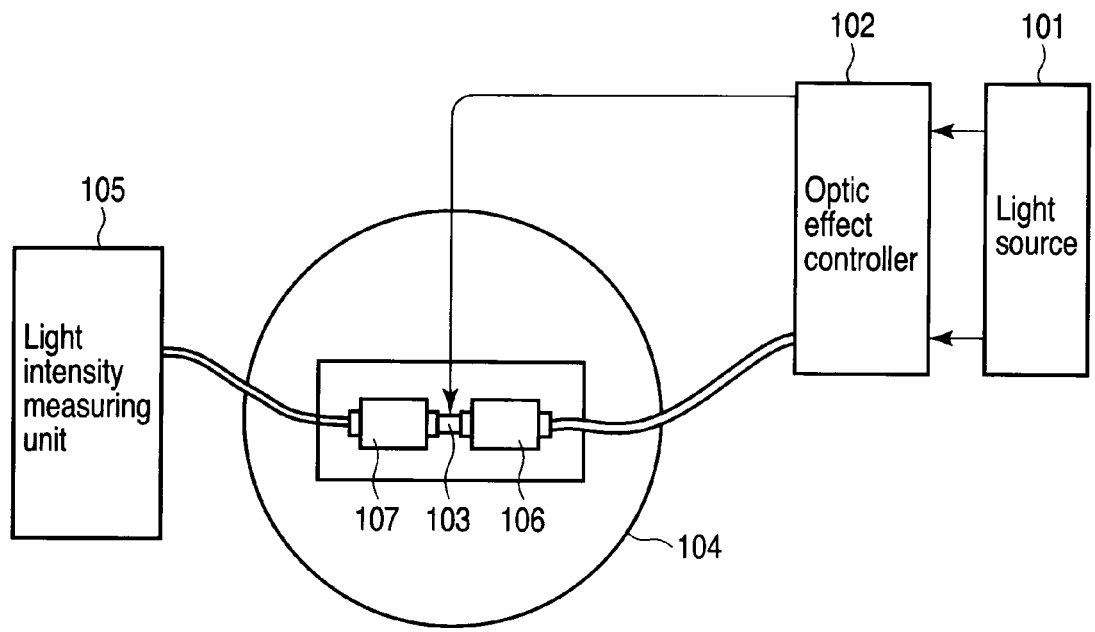
FIG. 1 is a block diagram illustrating a quantum computer according to an embodiment.

Referring to FIG. 1, a description will be given of a quantum computer according to the embodiment.

The quantum computer comprises a light source 101, an optic effect controller 102, a laminated unit 103, a cryostat 104, a light intensity measuring unit 105, a light introduction unit 106 and a light extraction unit 107.

The light source 101 generates laser beams and narrows down the spectral width of each laser beam. The light source 101 generates, for example, three laser beams.

The optic effect controller 102 sets the frequencies and intensities of the laser beams using optic effect elements.

The laminated unit 103 is formed by alternately stacking, on a substrate, three types of thin films A, B and C in this order. One thin film only contains only one type of physical systems. Each physical system has three or more energy states, and the two of the energy states that have longer coherence times are set to $|0>$ and $|1>$. $|0>$ and $|1>$ indicate a quantum bit. The remaining state is set to $|e>$. The three types of physical systems differ from each other in the transition angular frequency between $|0>$ and $|e>$ and between $|1>$ and $|e>$.

The cryostat 104 keeps the internal temperature at a low value (e.g., 1.5 K). The cryostat 104 contains the laminated unit 103.

The light introduction unit 106 introduces the light, controlled by the optic effect controller 102, to the lowest thin film of the laminated unit 103. The lowest thin film has, for example, a waveguide structure.

The light extraction unit 107 extracts light from the lowest thin film of the laminated unit 103 and outputs it to the light intensity measuring unit 105.

The light intensity measuring unit 105 measures the intensity of the light extracted by the light extraction unit 107.

The quantum computer and method of the embodiment of the present invention can impart a sufficiently long coherence time to a quantum bit and dispense with an extreme precise refining process, and can produce a read signal of high level and realize a sufficient scalability in the number of quantum bits.

A description will now be given of the operation mechanism of the quantum computer and method of the embodiment.

In the invention, a physical group formed of a large number of physical systems contained in a thin film is used as a single quantum bit, namely, one thin film corresponds to one quantum bit. Two of the three energy states of the physical systems, which have longer coherence times, are set to |0> and |1>. |0> and |1> indicate a quantum bit. The remaining state is set to |e>.

In the embodiment of the present invention, the laminated unit 103 uses three types of physical systems that differ from each other in the transition angular frequency between |0> and |e> and between |1> and |e>, i.e., three types of physical systems A, B and C, and sets so that one thin film contains only one type of physical systems (i.e., three thin films contain physical system groups A, B and C), or so that the influence of the physical systems other than one main type of physical systems can be ignored. Assuming that the three types of thin films are set as thin films A, B and C corresponding to the physical system groups A, B and C contained therein, these thin films are stacked as follows: In each pair of adjacent thin films, depending upon whether the physical system group in one of the adjacent films is in |0> or |1> or in |e>, the magnitude of interaction (e.g., the dipole-dipole interaction) between the physical system group in the one film and that in the other film varies, and the transition angular frequency of the physical system group in the other film between |0> and |e> and that between |1> and |e> collectively shift to the low energy side or high energy side by respective homogeneous broadenings of transition or more. In the thin films separate from each other, these films are set to a film thickness with which the interaction of the films can be ignored. If separate layers are provided between each adjacent pair of thin films, the separate layers and the thin films are set to separate layer and film thicknesses with which the interaction of these films can be ignored.

The three types of thin films A, B and C are stacked in the order of, for example, A, B, C, A, B, C, A, . . . , assuming that an end thin film (when, for example, the thin films are stacked on a substrate, the end thin film is the lowest thin film provided in direct contact with the substrate) is a film A.

A physical system group A(E) contained in the end thin film A (hereinafter referred to as the "thin film A(E)") has transition angular frequencies between |0> and |e> and between |1> and |e> different from those of the other thin films A, since, for example, only the thin film A(E) is in contact with the substrate (or since the substrate is stacked on the upper surface of the uppermost thin films and hence the thin film A(E) is the lowermost film having its lower surface kept out of contact with anything. Using this point, the state of the physical system group A(E) can be operated or read by adjusting the angular frequency of light applied thereto. Alternatively, a quantum bit formed of the physical system group A(E) can be read by making only the thin film A(E) to have an optical waveguide structure, operating only the physical system group A(E) using the light propagating the optical waveguide, and measuring the intensity of the light passing through the optical waveguide or that of the light emitted from the physical system group A(E).

Figure 2:
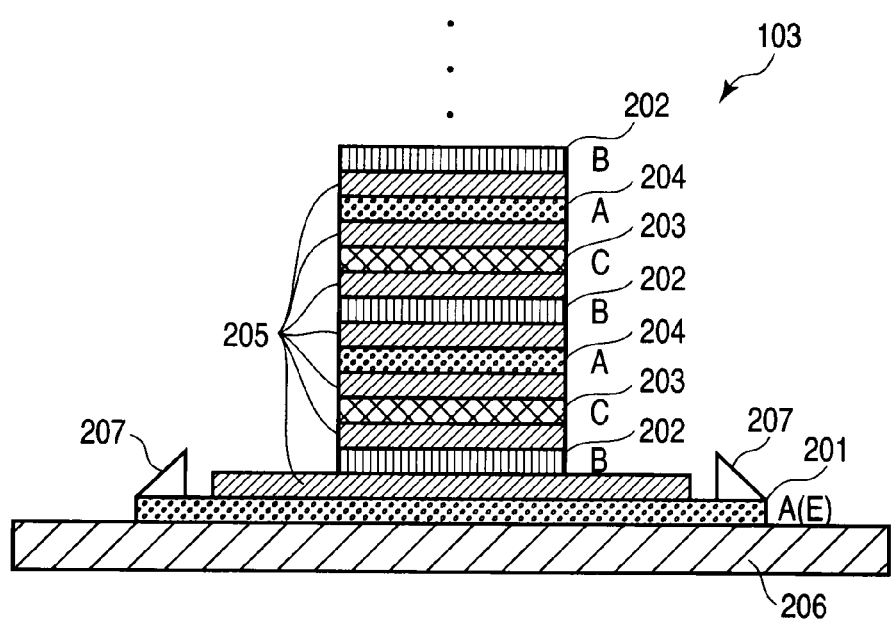
FIG. 2 is a view illustrating an example of a laminated unit shown in FIG. 1.

FIG. 2 is a schematic view of the case where a thin film A(E) 201 is formed to have an optical waveguide structure, illustrating a state in which thin films each providing one quantum bit are stacked on a substrate 206. In the example of FIG. 2, separation layers 205, and thin films A 204, B 202 and C 203 are alternately stacked. The separation layers 205 are effective to suppress interaction of physical systems contained in thin films that are not adjacent to each other, when the thin films are very thin.

To perform quantum computation using such a structure as shown in FIG. 2, in which only three types of thin films are stacked on each other, a method obtained by modifying the method proposed by S. Lloyd (see, for example, Science 261, 1569 (1993)) is used. Firstly, a description will be given of the quantum computer operation method, proposed by S. Lloyd, which employs one-dimensionally coupled physical systems, substantially along the explanations of S. Lloyd.

In the proposed quantum computer, three types of physical systems D, E and F each having a ground state |0> and an excited state |1> are coupled one-dimensionally in the order of, for example, D, E, F, D, E, F, D, . . . . Each physical system only interacts with a physical system (or physical systems) adjacent thereto, and has the transition angular frequency between the ground state and the excited state changed in accordance with the state of the physical system adjacent thereto. Assuming that |0> and |1> of a physical system p (p=D, E, F) are $|0>_p$ and $|1>_p$, and the states of the physical systems on the left and right sides of the physical system p are $|z>(z=0, 1)$ and $|z'>(z'=0, 1)$, the transition angular frequency $\omega^P_{zz'}$ of the physical system p between $|0>_p$–$|1>_p$ differs in accordance with the four combinations of z and z'. Further, the leftmost physical system D (hereinafter referred to as D(E)) has transition angular frequencies $\omega^D_0$ and $\omega^D_1$ between $|0>_D$–$|1>_D$ when the states of the right-side physical system E are $|0>_E$ and $|1>_E$, respectively. The transition angular frequencies $\omega^D_0$ and $\omega^D_1$ significantly differ from those of the other physical systems D, E and F, and hence it is considered that the leftmost physical system D can be operated independently of the other physical systems.

When a series of π pulses having angular frequencies $\omega^D_{01}$, $\omega^D_{11}$, $\omega^E_{10}$, $\omega^E_{11}$, $\omega^D_{01}$ and $\omega^D_{11}$ are applied in this order to the entire physical systems, the state of each of the physical systems D other than the physical system D(E) is exchanged for the state of the physical system E adjacent to each physical system D. FIG. 3 shows an example of this process. Each π pulse has a pulse area that satisfies the following equation (2), assuming that the electric field amplitude of its light pulse depends on time as given by the following expression (1):

$$\vec{E}(t) \tag{1}$$

$$\int \vec{\mu} \cdot \vec{E}(t) dt/\hbar = \pi \tag{2}$$

where $\vec{\mu}$ is the transition dipole moment of a transition with which the light pulse resonates, and $\hbar$ is Dirac constant.

The π pulse has a function of temporally developing, by the half-period of Rabi oscillation, a two-level system that resonates with the π pulse, and exchanging with each other the two states coupled by a transition that resonates with the light pulse.

When the π pulses of angular frequencies $\omega^D_{01}$, $\omega^D_{11}$, $\omega^E_{10}$, $\omega^E_{11}$, $\omega^D_{01}$ and $\omega^D_{11}$ are applied in this order to the entire physical systems, the bit values of the physical systems D and E included in a group in which the bit value of the physical system F is 1 are exchanged for each other, assuming that a series of physical systems D, E and F are regarded as one group. In contrast, if the bit of the physical system F is 0, the physical systems D and E remain unchanged. FIG. 4 shows an example of this process. The irradiation of the π pulses causes each group to have a Fredkin gate that uses F as a control bit.

If a light pulse having a pulse area represented by M given by the following equation (5), which will hereinafter be referred to as the "M pulse", is used as the light pulse applied to D(E) for independently operating the same, or applied to physical systems of the same type for simultaneously operating the systems, two resonant states |0> and |1> are temporally developed by the M/(2π) period of Rabi oscillation, whereby the state given by the following expression (6) generally shifts to the state given by the following expression (7):

$$\int \vec{\mu} \cdot \vec{E}(t) dt / \hbar = M \quad (5)$$

$$\alpha|0\rangle + \beta|1\rangle \quad (6)$$

where α and β are complex numbers that satisfy $|\alpha|^2 + |\beta|^2 = 1$ $$(\alpha \cos(M/2) - i\beta \sin(M/2))|0\rangle + (-i\alpha \sin(M/2) + \beta \cos(M/2))|1\rangle \quad (7)$$

An initially non-superposition state (α=1 or β=1) can also be shifted to a superposition state. In this state, a rotation gate as a one-quantum bit gate is realized.

Combination of the independent operation of D(E), the exchange operation between physical systems of a designated type, the Fredkin gate using, as a control bit, the value of a physical system F in a target group, and the rotation gate enables information to be written to, processed by and read from physical systems coupled one dimensionally as proposed by S. Lloyd. Information is first written to the physical system D(E), and transferred to another physical system by the exchange operation. This process is repeated, and information is stored in a plurality of physical systems. Information processing is executed by moving information between physical systems through the exchange operation, and operating, for example, the Fredkin gate. Further, information reading is executed by moving information to the physical system D(E) through the exchange operation, and checking a response of D(E) to an independent operation thereof. Thus, quantum computation is realized. The above is a method of operating a quantum computer proposed by S. Lloyd.

A description will now be given of how the above-described method is modified to execute quantum computation in the quantum computer of the embodiment of the present invention, in which the three states of each physical system is used, and thin films containing such physical systems are stacked.

In the method of the embodiment of the present invention, the transmission angular frequency of each physical system group is not changed by whether another physical system group adjacent thereto is in |0> or |1>. When the state of the adjacent physical system group shifts from |0> or |1> to |e>, the transmission angular frequency changes for the first time. Further, the resultant transmission angular frequency is not the transmission angular frequency between |0> and |1>.

In the invention, the transmission angular frequency, between |y>x and |e>x (y=0, 1), of a physical system group x contained in a second or upper thin film x (x=A, B, C) from the bottom is set to ωx ye, gg, if the physical system group contained in a lower thin film provided in contact with the lower surface of the thin film x is in |y>, and if the physical system group contained in an upper thin film provided in contact with the upper surface of the thin film x is in |y'>(y'=0, 1). Similarly, the transmission angular frequency of the physical system group x between $|y\rangle_x$ and $|e\rangle_x$ is set to $\omega_{x, ye, ge}$, if the physical system group contained in the lower thin film provided in contact with the lower surface of the thin film x is in |y>, and if the physical system group contained in the upper thin film provided in contact with the upper surface of the thin film x is in |e>. Further, the transmission angular frequency of the physical system group x between $|y\rangle_x$ and $|e\rangle_x$ is set to $\omega_{x, ye, eg}$, if the physical system group contained in the lower thin film is in |e>, and if the physical system group contained in the upper thin film is also in |e>. In addition, the transmission angular frequency, between $|y\rangle_{A(E)}$ and $|e\rangle_{A(E)}$ (y=0, 1), of a physical system group A (hereinafter, the "physical system group A(E)") contained in the lowermost thin film A (hereinafter, the thin film "A(E)") is set to ωA(E), ye, g, if the physical system group B contained in the upper thin film B is in $|y'\rangle_B$ (Y'=0, 1). Further, if the physical system group B contained in the upper thin film B is in $|e\rangle_B$, the transmission angular frequency of the physical system group A between $|y\rangle_{A(E)}$ and $|e\rangle_{A(E)}$ is set to $\omega_{A(E), ye, e}$.

The physical systems just below the certain physical system group x will hereinafter be referred to as the "physical systems x−1," and those just above the physical system group x as the "physical systems x+1."

When operating the physical system groups other than the end physical system group A(E), eight π pulses having angular frequencies $\omega_{x-1, 1e, gg}, \omega_{x-1, 1e, ge}, \omega_{x-1, 1e, eg}, \omega_{x-1, 1e, ee}, \omega_{x+1, 1e, gg}, \omega_{x+1, 1e, ge}, \omega_{x+1, 1e, eg}, \omega_{x+1, 1e, ee}$ are applied to them, then three π pulses having angular frequencies $\omega_{x, 0e, qq'}, \omega_{x, 1e, qq'}, \omega_{x, 0e, qq'}$ (q=g, e; q'=g, e) are applied to them, and again the eight π pulses having angular frequencies $\omega_{x-1, 1e, gg}, \omega_{x-1, 1e, ge}, \omega_{x-1, 1e, eg}, (\omega_{x-1, 1e, ee}, \omega_{x+1, 1e, gg}, \omega_{x+1, 1e, ge}, \omega_{x+1, 1e, eg}, \omega_{x+1, 1e, ee}$ are applied to them, instead of applying a light pulse $\omega^P_{zz'}$(z=0, 1; z'=0, 1) in the method of S. Lloyd. Note here that regarding the relationship between p=D, E and F and x=A, B and C, D is made to correspond to A, E to B, and F to C. Similarly, regarding the relationship between z, z' and q, q', 0 is made to correspond to g, and 1 is made to correspond to e. FIG. 5 shows an operation example of physical system groups using the above-mentioned nineteen π pulses corresponding to $\omega^P_{o1}$. As is understood from FIG. 5, after applying the nineteen π pulses, the bit value of the physical system group x (x=A, x−1=0, and x+1=1) is inverted, and the other physical system groups are not influenced by the pulses.

The first eight π pulses shift, to |e>, the states of the physical system groups x−1 and x+1 located just below and above the physical system group x as a substantial operation target, if their states are |1>. The next three π pulses invert the states of the physical system groups x−1 and x+1 only when one of the physical system groups x−1 and x+1 is in the original state |z> or |z'>(assumed before the irradiation of the first eight π pulses). The last eight T pulses return the states (|e>) of the physical system groups x−1 and x+1 to |1>.

In the irradiation of the above-mentioned series of π pulses, the order of application of the first eight π pulses and that of the last eight π pulses are not limited. Further, four $(\omega_{x-1, 1e, gg}, \omega_{x-1, 1e, ge}, \omega_{x-1, 1e, eg}, \omega_{x-1, 1e, ee})$ of the eight π pulses, which operate the physical system group x−1, and the other four π pulses $(\omega_{x+1, 1e, gg}, \omega_{x+1, 1e, ge}, \omega_{x+1, 1e, eg}, \omega_{x+1, 1e, ee})$, which operate the physical system group x+1, may be applied simultaneously.

In the embodiment of the present invention, the above light pulse irradiation can provide the same effect as the irradiation of the light pulses having the angular frequency $\omega^P_{zz'}$ employed in the S. Lloyd method, although the physical systems are used, in which any transition frequency changes due to changes in interaction do not occur regardless of whether the quantum bit is |0> or |1>. This enables even the thin-film stacked structure the embodiment of the present invention including the three-state systems to execute the above-mentioned exchange operation and Fredkin gate operation.

The independent operation of the physical system group A(E) as the end group can be realized by irradiation of light with the angular frequency $\omega_{A(E), ye, g}$ or $\omega_{A(E), ye, e}$. For instance, irradiation of three light pulses, i.e., the π pulse $\omega_{A(E), 0e, q}$, the M pulse $\omega_{A(E), 1e, q}$ and the π pulse $\omega_{A(E), 0e, q}$ enables the physical system group A(E) to execute rotation gate operation when the physical system group located just above the physical system group A(E) is in $|q\rangle$ ($q=g, e$).

When executing the above-mentioned irradiation of three pulses (included in the series of irradiation of first eight pulses, next three pulses and last eight pulses), if the three pulses are M pulses, rotation can be realized only when one of the physical system groups x−1 and x+1 is in the original state $|z\rangle$ or $|z'\rangle$ (assumed before the irradiation of the first eight n pulses).

As described above, the independent operation of A(E), the operation of exchanging the states of physical system groups of designated types, the Fredkin gate operation and the rotation gate operation are enabled. The combination of these operations enables information to be written to, processed in, and read from the stacked thin films. Thus, quantum computation can be realized.

The above-described embodiment, in which light pulses having their frequencies and intensities adjusted are sequentially applied to the entire laminated structure, enables quantum bits to have sufficiently long coherence times, enables strict microfabrication to be unnecessary, enables read signals of high level, and enables a sufficient scalability in the number of quantum bits.

EXAMPLE

In a quantum computer and quantum computation method according to an example, $Pr^{3+}:Y_2SiO_5$ crystal in which 0.005% $Y^{3+}$ ions in $Y_2SiO_5$ crystal are replaced with $Pr^{3+}$ ions, $Eu^{3+}:Y_2SiO_5$ crystal in which 0.005% $Y^{3+}$ ions in $Y_2SiO_5$ crystal are replaced with $Eu^{3+}$ ions, and $Er^{3+}:Y_2SiO_5$ crystal in which 0.005% $Y^{3+}$ ions in $Y_2SiO_5$ crystal are replaced with $Er^{3+}$ ions are used as physical systems having three energy states. The two states of the nuclear spin of an ion in the electron ground state, which is included in rare-earth ions in each crystal, are expressed as $|0\rangle$ and $|1\rangle$.

Figure 6:
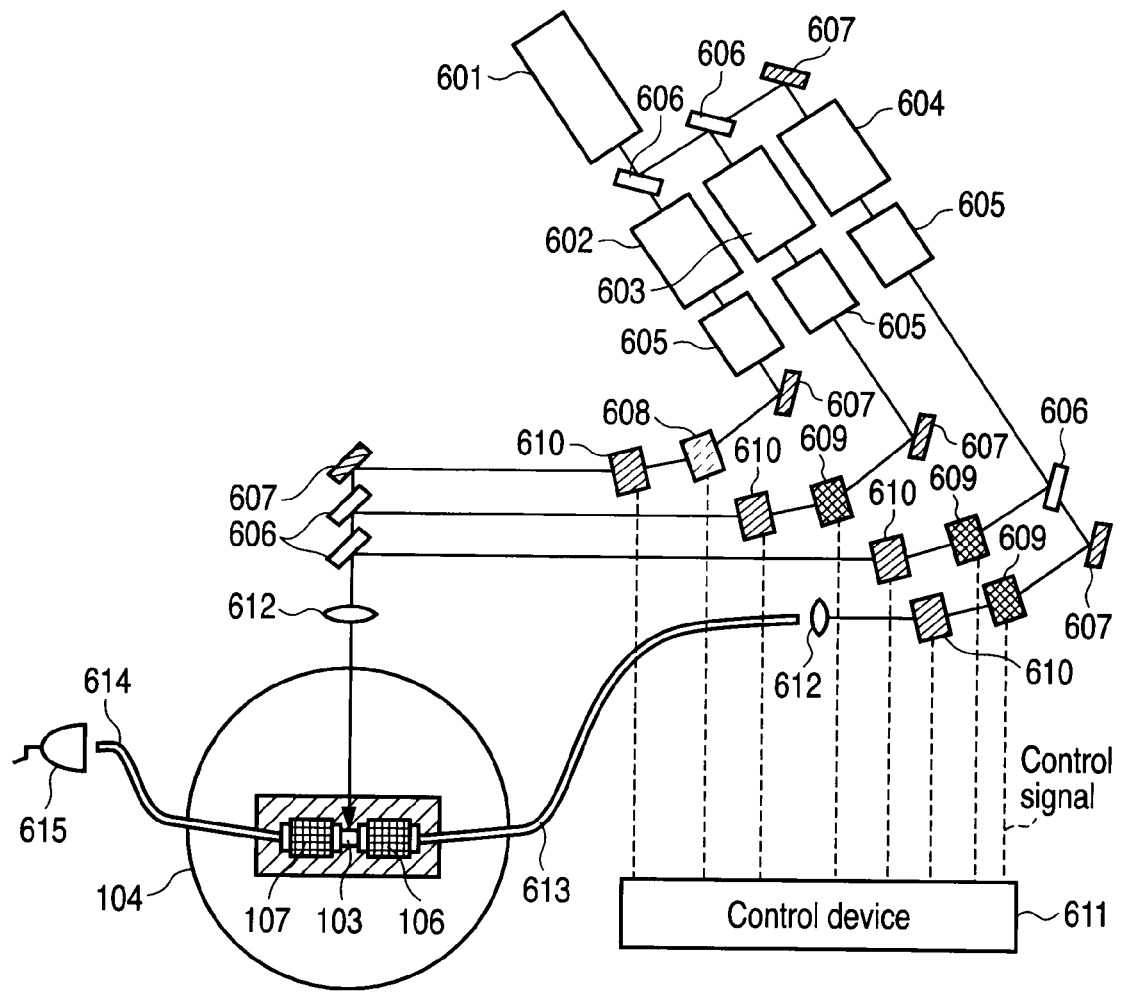
FIG. 6 is a block diagram illustrating a quantum computer according to an example.

Referring now to FIG. 6, the quantum computer of the example will be described.

The quantum computer of the example comprises an argon ion laser 601, a ring-dye laser (laser ER) 602, a ring-dye laser (laser EU) 603, a ring-dye laser (laser PR) 604, three laser frequency narrowing systems 605, five beam splitters 606, five mirrors 607, a frequency-setting electro-optic effect element 608, three frequency-setting acousto-optic effect elements 609, four intensity-setting acousto-optic effect elements 610, a control device 611, two lenses 612, optical fibers 613 and 614, a photodiode 615, a cryostat 104, a light introduction unit 106, and a light extraction unit 107.

The argon ion laser 601 generates a laser beam. This laser beam is split into two beams by one of the beam splitters 606, one of the beams being input to the ring-dye laser (laser ER) 602, the other beam being input to another beam splitter 606 where it is split into two beams. One of the beams split by said another beam splitter 606 is input to the ring-dye laser (laser EU) 603, and the other beams is reflected by one of the mirrors 607 and then input to the ring-dye laser (laser PR) 604.

The laser frequency narrowing systems 605 narrow, to 1 kHz, the respective spectrum widths of the beams (laser beams ER, EU and PR) output from the ring-dye lasers. The narrowed laser beam PR is split into two beams by the corresponding one of the beam splitters 606, and these beams are input to the corresponding intensity-setting acousto-optic effect elements 610 via the corresponding mirror 607 and the corresponding frequency-setting acousto-optic effect elements 609. The frequency-setting acousto-optic effect elements 609 set temporal change histories concerning the frequencies of the laser beams, and the intensity-setting acousto-optic effect elements 610 set temporal change histories concerning the intensities of the laser beams. The narrowed laser beam EU is directly input to the corresponding frequency-setting acousto-optic effect elements 609 and then to the corresponding intensity-setting acousto-optic effect elements 610, where the frequency and intensity change histories of the narrowed laser beam EU are set.

The narrowed laser beam ER is input to the corresponding intensity-setting acousto-optic effect elements 610 via the frequency-setting electro-optic effect element 608. The frequency-setting electro-optic effect element 608 can operate at a higher frequency than the frequency-setting acousto-optic effect elements 609. Since the narrowed laser beam ER needs a greater frequency shift than the other laser beams, the frequency-setting electro-optic effect element 608 is used for it.

The optical paths for the laser beams PR, EU and ER having their frequencies and intensities set are united using the other mirror 607 and beam splitters 606, whereby the laser beams are converged by one of the lenses 612 so that they are uniformly applied to the thin-film section (1 mm×1 mm section) of the laminated unit 103 placed in the cryostat 104. As a result, the laser beams are applied to the stacked thin films through a window formed in the cryostat 104. The other beam of the laser beam PR is guided via the other lens 612 to the optical fiber 613 connected to the light introduction unit 106.

The control device 611 controls the frequency-setting electro-optic effect element 608, the three frequency-setting acousto-optic effect elements 609, and the four intensity-setting acousto-optic effect elements 610 to generate light pulses necessary for operating and reading quantum bits.

The photodiode 615 receives, via the optical fiber 614, the light extracted by the light extraction unit 107, and measures the intensity of the light.

In the laminated unit 103, thin films are formed of three types of crystal and are stacked on each other. In the example, assume that the thin film of $Pr^{3+}:Y_2SiO_5$ crystal, that of $Eu^{3+}:Y_2SiO_5$ crystal and that of $Er^{3+}:Y_2SiO_5$ crystal are films PR, EU and ER. The thin films are stacked on an $SiO_2$ substrate of 5 mm×10 mm×1 mm cyclically in the order of PR, EU, ER, PR, EU, ER, . . . , from the bottom. Further, $SiO_2$ separation layers are interposed between pairs of adjacent ones of the thin films. The thin films and the separation layers have a thickness of 50 nm. Assume also that the lowest thin film PR that is in contact with the substrate is a film PR(E). The thin film other than the film PR(E) has a size of 1 mm×1 mm along the surface of the substrate. The film PR(E) has a size of 1 mm×7 mm and has an optical waveguide structure. Only a portion of the film PR(E), which has a size of 1 mm×1 mm and on which the other thin films are stacked, contains $Pr^{3+}$ ions, and the other portion of the film PR(E) is formed of $Y_2SiO_5$.

Figure 7A:
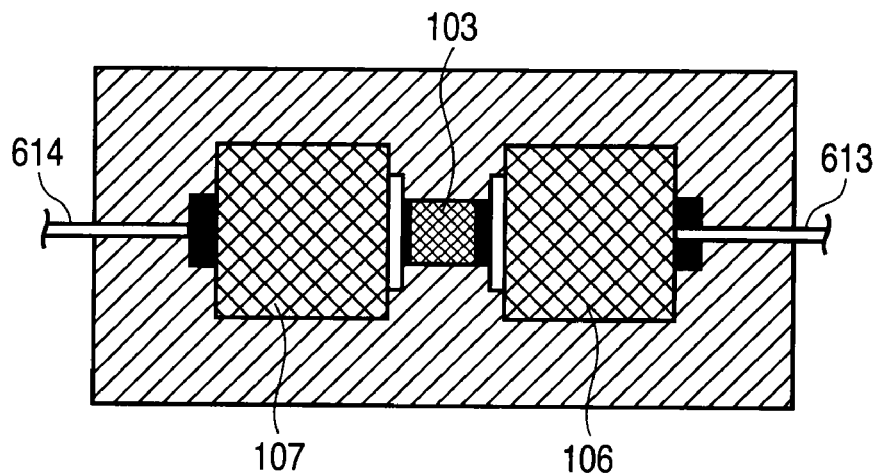
FIGS. 7A and 7B are views illustrating a light extraction unit, a laminated unit and a light introduction unit shown in FIG. 6.
Figure 7B:
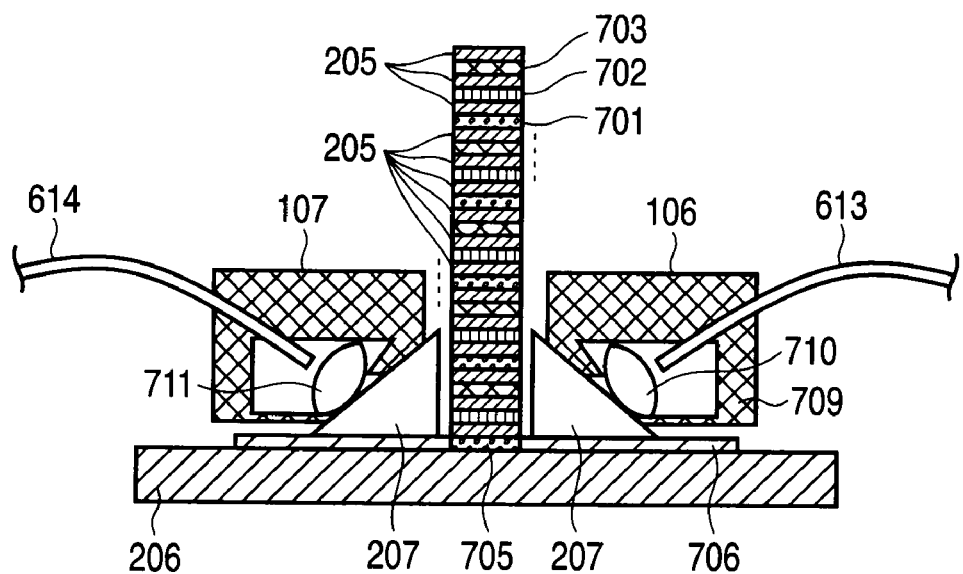

The lowest thin film has an optical waveguide structure, and is connected to a light introduction unit for introducing light from the outside, and a light extraction unit for extracting light from the optical waveguide, each of the light introduction unit and the light extraction unit being formed of a coupling prism, a coupling lens and an optical fiber. FIGS. 7A and 7B show an example of a laminated structure in which thin films PR 701, EU 702 and ER 703 are stacked on each other by five cycles. It should be noted that FIGS. 7A and 7B show a positional relationship, and the relative sizes of the elements are not exactly shown. In particular, the thickness of each thin film of the laminated structure is magnified.

This laminated structure may be formed by stacking the thin films using sputtering, and then etching the resultant structure. Alternatively, it may be formed by adhering monocrystal to the substrate 206 using optical contact, then performing chemical mechanism polishing (CMP) on the crystal to form a thin film, then adhering a separation layer 205 to the thin film, and polishing the separation layer 205 to form a separation thin film. In this case, a series of these steps are repeated to form a laminated film, and the laminated film is etched.

The laminated films are kept at 1.5 K in the cryostat 104, and the optical fibers 613 and 614 are connected to the light introduction unit 106, and the light extraction unit 107, respectively. The optical fiber 613 is also connected to a light source section (formed of the argon ion laser 601, the ring-dye laser (laser ER) 602, the ring-dye laser (laser EU) 603, the ring-dye laser (laser PR) 604). The optical fiber 614 is also connected to the quantum-bit reading section (photodiode 615) to guide output light. The light from the light source section is divided into two beams. One of them is applied to the laminated film through the window of the cryostat 104, and the other beam is applied to the $Pr^{3+}$ ions in the thin film PR(E) through the optical fiber 613.

Referring to FIG. 6, a description will be given of a pre-process for selecting rare-earth ions used as quantum bits necessary for the example, initialization of quantum bits necessary for quantum computation, quantum bit gate operation, and quantum bit reading.

Regarding thin films REI (REI=PR, PR(E), EU, ER), the two states used as a quantum bit and included in the states of the nuclear spin of each rare-earth ion in the electron ground state (each rare-earth ion is a $Pr^{3+}$ ion if REI is PR, an $Eu^{3+}$ ion if REI is EU, and an $Er^{3+}$ ion if REI is ER) are set to $|0>_{REI}$ and $|1>_{REI}$. The other state, which is not used as a quantum bit, is set to $|a>_{REI}$. The transition angular frequency between $|0>_{REI}-|1>_{REI}$ is set to $\omega_{REI, 01}$, and the transition angular frequency between $|a>_{REI}-|0>_{REI}$ is set to $\omega_{REI, a0}$. However, assume that in the example, the difference between $\omega_{PR, 01}$ and $\omega_{PR(E), 01}$, and that between $\omega_{PR, a0}$ and $\omega_{PR(E), a0}$ can be ignored. Also assume that between the states $|0>_{REI}$, $|1>_{REI}$ and $|a>_{REI}$, the level of energy decreases in the order of $|1>_{REI}$, $|0>_{REI}$ and $|a>_{REI}$.

Assume here that the thin films located just below and above a certain target thin film REI are set as a thin film REI−1 and a thin film REI+1, respectively. Assume further that the angular frequency, which resonates within inhomogeneous broadening with the $^3H_4-^1D_2$ transition of each $Pr^{3+}$ ion in a thin film PR when thin films PR−1 and PR+1 are in $|0>$ or $|1>$, is set as $\omega_{PR, 0e, gg}$, that the angular frequency, which resonates within inhomogeneous broadening with the $^7F_0-^5D_0$ transition of each $Eu^{3+}$ ion in a thin film EU when thin films EU−1 and EU+1 are in $|0>$ or $|1>$, is set as $\omega_{EU, 0e, gg}$, and that the angular frequency, which resonates within inhomogeneous broadening with the $^4I_{15/2}-^4F_{9/2}$ transition of each $Pr^{3+}$ ion in a thin film PR when thin films PR−1 and PR+1 are in $|0>$ or $|1>$, is set as $\omega_{ER, 0e, gg}$. Similarly, the angular frequency, which resonates within inhomogeneous broadening with the $^3H_4-^1D_2$ transition of each $Pr^{3+}$ ion in a thin film PR(E) when a thin film EU (PR(E)+1) is in $|0>_{EU}$ or $|1>_{EU}$, is set as $\omega_{PR(E) 0e, g}$, and that the angular frequency, which resonates within inhomogeneous broadening with the $^3H_4-^1D_2$ transition of each $Pr^{3+}$ ion in the thin film PR(E) when the thin film EU (PR(E)+1) is in $|e>_{EU}$, is set as $\omega_{PR(E) 0e, e}$. However, in the example, assume that $|\omega_{PR, 0e, gg}-\omega_{PR(E), 0e, g}|>1$ GHz.

The following operations (1) and (2) are executed in this order on the thin films REI=PR, PR(E), EU and ER.

(1) A laser beam is applied while sweeping its angular frequency between $\omega_{REI, 0e, gg}-500\times2\pi$ kHz and $\omega_{REI, 0e, gg}+500\times2\pi$ kHz. (2) After that, light of $\omega_{REI, 0e, gg}-\omega_{REI, 01}$ (if REI=PR(E), $\omega_{REI, 0e, g}-\omega_{REI, 01}$) is applied for 100 ms. Where light of $\omega_{REI, 0e, gg}$ is applied, main rare-earth ions that resonate with the light are those that resonate with a transition between $|0>_{REI}-|e>_{REI}$ (or a transition between $|1>_{REI}-|e>_{REI}$ if the energy of $|1>_{REI}$ is lower than $|0>_{REI}$).

Thereafter, a π pulse having angular frequency $\omega_{EU, 0e, gg}$ is applied to set the $Eu^{3+}$ ions in $|e>_{EU}$. Subsequently, a combination of a π pulse having angular frequency $\omega_{PR, re}$ and a π pulse having angular frequency $\omega_{PR, re}+\omega_{PR, a0}$ (or having angular frequency $\omega_{PR, re}-\omega_{PR, a0}$ if the energy of $|0>_{PR}$ is lower than that of $|a>_{PR}$) is applied ten times (i.e., ten combinations of π pulses are applied in total) while varying the value of $\omega_{PR, re}$ and/or the duration of the pulses. The angular frequency $\omega_{PR, re}$ falls within a range of approx. $1\times2\pi$ MHz that excludes an angular frequency range having a width $\Delta\omega PR$, bit=$10\times2\pi$ kHz and using, as a center of the width, angular frequency $\omega_{PR, 0e, gg}+\Delta\omega_{PR, 0e, ge}$ deviated from $\omega_{PR, 0e, gg}$ by $\Delta\omega_{PR, 0e, ge}$. After that, a π pulse having the angular frequency $\omega_{EU, 0e, gg}$ is again applied to return the $Eu^{3+}$ ions to $|0>_{EU}$. As a result, ions collectively further biased in energy by $\omega_{PR, 0e, ge}$ when $Eu^{3+}$ ions are in $|e>_{EU}$ than in $|0>_{EU}$, i.e., ions of angular frequency $\omega_{PR, 0e, ge}=\omega_{PR, 0e, gg}+\Delta\omega_{PR, 0e, ge}$, can be selected as $Pr^{3+}$ ions in $|0>_{PR}$.

In the ion selection process, during the period until the $Eu^{3+}$ ions are returned to $|0>_{EU}$ by π pulse re-irradiation after the $Eu^{3+}$ ions are shifted to $|e>_{EU}$ by π pulse irradiation, the same process is executed on the $Pr^{3+}$ ions in the thin film PR(E), as well as those in the thin films PR. Namely, a combination of a n pulse having angular frequency $\omega_{PR(E), re}$ and a π pulse having angular frequency $(\omega_{PR(E), re}+\omega_{PR(E), a0}$ is applied to the thin film PR(E) ten times (i.e., ten combinations of π pulses are applied in total) while varying the value of $\omega_{PR(E), re}$ and/or the duration of the pulses. The angular frequency $(\omega_{PR(E), re}$ falls within a range of approx. $1\times27$ MHz that excludes an angular frequency range having a width of $\Delta\omega_{PR(E), bit}=10\times2\pi$ kHz and using, as a center of the width, angular frequency $(\omega_{PR(E), 0e, gg}+\Delta\omega_{PR(E), 0e, ge}$. As a result, ions of $(\omega_{PR(E), 0e, e}=\omega_{PR(E), 0e, g}+\Delta\omega_{PR(E), 0e, e}$ can be selected as $Pr^{3+}$ ions in the thin film PR(E).

Further, a π pulse having the angular frequency $\omega_{ER, 0e gg}$ is applied to set the $Er^{3+}$ ions to $|0>_{ER}$. After that, a combination of a π pulse having angular frequency $\omega_{EU, re}$ and a π pulse having angular frequency $\omega_{EU, re}+\omega_{EU, a0}$ (or having angular frequency $\omega_{EU, re}-\omega_{EU, a0}$ if the energy of $|0>_{EU}$ is lower than that of $|a>_{EU}$) is applied ten times (i.e., ten combinations of π pulses are applied in total) while varying the value of $\omega_{EU, re}$ and/or the duration of the pulses. The angular frequency $\omega_{EU, re}$ falls within a range of approx. $1\times2\pi$ MHz that excludes an angular frequency range having a width of $\Delta\omega_{EU, bit}=10\times2\pi$ kHz and using, as a center of the width, angular frequency $\omega_{EU, 0e, gg}+\Delta\omega_{EU, 0e, ge}$. After that, a π pulse having the angular frequency $\omega_{ER, 0e, gg}$ is again applied to return the $Er^{3+}$ ions to $|0>_{ER}$. As a result, ions of $\omega_{EU, 0e, ge}=\omega_{EU, 0e, gg}+\Delta\omega_{EU, 0e, ge}$, can be selected as $Eu^{3+}$ ions of the thin films EU.

In addition, a π pulse having the angular frequency $\omega_{PR, 0e, gg}$ is applied to set the $Pr^{3+}$ ions to $|e>_{PR}$. After that, a combination of a π pulse having angular frequency $\omega_{ER, re}$ and a π pulse having angular frequency $\omega_{EP, re}+\omega_{ER, a0}$ (or having angular frequency $\omega_{ER, re}-\omega_{ER, a0}$ if the energy of $|0>_{ER}$ is lower than that of $|a>_{ER}$) is applied ten times (i.e., ten combinations of π pulses are applied in total) while varying the value of $\omega_{ER, re}$ and/or the duration of the pulses. The angular frequency $\omega_{ER, re}$ falls within a range of approx. $1\times27$ MHz that excludes an angular frequency range having a width of $\Delta\omega_{ER, bit}=10\times2n$ kHz and using, as a center of the width, angular frequency $\omega_{ER, 0e, gg}+\Delta\omega_{ER, 0e, ge}$. After that, a π pulse having the angular frequency $\omega_{PR, re}$ is again applied to return the $Pr^{3+}$ ions to $|0>_{PR}$. As a result, ions of $\omega_{ER, 0e, ge} = \omega_{ER, 0e, gg} + \Delta\omega_{ER, 0e, ge}$, can be selected as $Er^{3+}$ ions of the thin films ER.

At this time, it is considered that from the rare-earth ions contained in a target thin film REI, a transition of which between $|0>_{REI} - |e>_{REI}$ resonates with a light beam of angular frequency $\omega_{REI, 0e, gg}$ when the rare-earth ions contained in a thin film adjacent to the target thin film is in the electron ground state ($|0>$ or $|1>$), ions, a transition of which between $|0>_{REI} - |e>_{REI}$ (and transition between $|1>_{REI} - |e>_{REI}$) is collectively further biased in energy, depending upon whether the rare-earth ions contained in the thin film adjacent to the target thin film is in the electron ground state or electron excited state $|e>$), are selected. Further, by selectively setting the ions selected by the above operation in $|e>$, and measuring the absorption spectra of the ions of the other types, the value of $\omega_{REI, 0e, eg}$ is obtained if the thin film REI−1 is in $|e>$, and the thin film REI+1 is in $|0>$ or $|1>$, and the value of $\omega_{REI, 0e, ee}$ is obtained if the thin films REI−1 and REI+1 are both in $|e>$.

In the example, the rare-earth ions set in $|0>_{REI}$ by the above process are used as a quantum bit in units of thin films.

The quantum bit (thin film PR(E)) located at the end can be independently operated by applying thereto light with angular frequencies $\omega_{PR(E), 0e, g}$ and $\omega_{PR(E), 0e, g} - \omega_{PR(E), 01}$ or light with angular frequencies $\omega_{PR(E), 0e, e}$ and $\omega_{PR(E) 0e, e} - \omega_{PR(E), 01}$. For instance, after the above process, three pulses, i.e., a π pulse of angular frequency $\omega_{PR(E), 0e, g}$, an M pulse of angular frequency $\omega_{PR(E), 0e, g} - \omega_{PR(E), 01}$, and a π pulse of angular frequency $\omega_{PR(E), 0e, g}$ are sequentially applied to the quantum bit at the end to thereby execute a rotation gate operation in which the quantum bit at the end is rotated through M. If a π pulse is used in place of the M pulse, an inverse gate operation is executed.

Further, eight π pulses having angular frequencies $\omega_{REI-1,1e,gg} = \omega_{REI-1,0e,gg} - \omega_{REI,01}$, $\omega_{REI-1,1e,ge} = \omega_{REI-1,0e,ge} - \omega_{REI,01}$, $\omega_{REI-1,1e,eg} = \omega_{REI-1,0e,eg} - \omega_{REI,01}$, $\omega_{REI-1,1e,ee} = \omega_{REI-1,0e,ee} - \omega_{REI,01}$, $\omega_{REI+1,1e,gg} = \omega_{REI+1,0e,gg} - \omega_{REI,01}$, $\omega_{REI+1,1e,ge} = \omega_{REI-1,0e,ge} - \omega_{REI,01}$, $\omega_{REI+1,1e,eg} = \omega_{REI+1,0e,eg} \omega_{REI,01}$, $\omega_{REI+1,1e,ee} = \omega_{REI+1,0e,ee} - \omega_{REI,01}$ are firstly applied, and then three light pulses, i.e., a π pulse of $\omega_{REI, 0e, qq}$, an M pulse of $\omega_{REI, 1e, qq}$, and a π pulse of $\omega_{REI, 0e, qq'}$ (q=g, e; q'=g, e), are applied, and lastly, eight π pulses identical to the first-mentioned eight π pulses are applied. As a result, the quantum bit of a target thin film REI can be rotated through M in accordance with the bit values z and z' of the thin films located just above and below the target thin film REI, only when the bit value of the thin film REI−1 is z and that of the thin film REI+1 is z'. The values z and z' are set in accordance with q and q' (if q=g, z=C; if q=e, z=1; if q'=g, z'=C; if q'=e, z'=1). If a π pulse is used in place of the M pulse, a conditioned inverse gate operation is executed on the target thin film REI.

Combinations of the above processes enable exchange operations and Fredkin gate operations between quantum bits formed of rare-earth ion groups of a designated type, and also enable information to be written to quantum bits of stacked thin films and to be processed.

The information (i.e., the value of each quantum bit) obtained by processing is transmitted to the end quantum bit (formed of the thin film PR(E)) by exchange operations, and is read therefrom. When reading information, light beams of angular frequencies $\omega_{PR(E), 0e, g}$ and $\omega_{PR, 0e, e}$ are applied through the optical waveguide. If both light beams show little reduction in transmitted light intensity, the quantum bit is in $|1>$, whereas if one of these light beams shows a reduction in transmitted light intensity due to absorption, the quantum bit is in $|0>$. At this time, quantum bit reading may be executed by observing an increase in emission due to absorption.

In the above-described example, irradiation of the thin film PR(E) with light may be executed by applying light to the entire stacked thin films, or through an optical waveguide.

Further, when executing the above-described operation (2), if light of angular frequency $\omega_{REI, 0e, gg} + \omega_{REI, 01}$ (where REI=PR(E), light of angular frequency $\omega_{REI, 0e, g} + \omega_{REI, 01}$) is applied instead of light of angular frequency $\omega_{REI, 0e, gg} - \omega_{REI, 01}$ (where REI=PR(E), light of angular frequency $\omega_{REI 0e, g} - \omega_{REI, 01}$), and then light of $\omega_{REI, 0e, gg}$ is applied, the main rare-earth ions that resonate with this light may be set to those that resonate a transition between $|1>_{REI} - |e>_{REI}$.

As described above, when light pulses having their frequencies and intensities adjusted are sequentially applied to the entire stacked films containing rare-earth ions, using the quantum computer and method of the embodiment, a sufficiently long coherence time of each quantum bit and an extreme precise refining process can be made unnecessary, a read signal of high level can be produced, and a sufficient scalability in the number of quantum bits can be realized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A quantum computer and method comprising:

a laminated unit including a plurality of thin films A each containing a physical system group A' formed of a plurality of physical systems A", a plurality of thin films B each containing a physical system group B' formed of a plurality of physical systems B", and a plurality of thin films C each containing a physical system group C' formed of a plurality of physical systems C", the thin films A, B and C being alternately stacked on each other with a thin film A positioned lowest, in an order of A, B, C, A, B, C, A, . . . , each of the physical systems A", B" and C" having three different energy states $|0>_x$, $|1>_x$, $|e>_x$ (suffix x indicating a state of each of physical systems x", and x" representing A", B" and C" that represent types of the physical systems, the physical systems x" providing physical system groups x'), a quantum bit being expressed by a quantum mechanical superposition state of $|0>_x$ and $|1>_x$;

a light source which generates a plurality of light beams having angular frequencies $\omega_{A(E), ye, g}$, $\omega_{A(E), ye, e}$, $\omega_{x, ye, gg}$, $\omega_{x, ye, ge}$, $\omega_{x, ye, eg}$ and $\omega_{x, ye, ee}$, and having spectral widths narrower than differences between the angular frequencies, and applies the light beams to the thin films, an angular frequency $\omega_{A(E), ye, g}$ being a $|y>_{A(E)} - |e>_{A(E)}$ (y=0, 1) transition angular frequency of one (physical system group A(E)') of the physical system groups A' that is contained in a lowest one (thin film A(E)) of the thin films A, the $|y>_{A(E)} - |e>_{A(E)}$ transition angular frequency being assumed when one of the physical system groups B' that is contained in one of the thin films B that is located just above the thin film A(E) is in $|y'>_B$ (y'=0, 1), the angular frequency $\omega_{A(E), ye, e}$ being the $|y>_{A(E)} - |e>_{A(E)}$ transition angular frequency assumed when the one of physical system group B' is in $|e>_B$, an angular frequency $\omega_{x, ye, gg}$ being a $|y>_x - |e>_x$ transition angular frequency of a first one of the physical system groups x' which excludes the physical system group A(E)', the $|y\rangle_x-|e\rangle_x$ transition angular frequency being assumed when a second one of the physical system groups x' located just below the first one is in $|y\rangle$ and a third one of the physical system groups x' located just above the first one is in $|y'\rangle$, an angular frequency $\omega_{x,\,ye,\,ge}$ being the $|y\rangle_x-|e\rangle_x$ transition angular frequency of the first one assumed when the second one is in $|y\rangle$ and the third one is in $|e\rangle$, the angular frequency $\omega_{x,\,ye,\,eg}$ being the $|y\rangle_x-|e\rangle_x$ transition angular frequency of the first one assumed when the second one is in $|e\rangle$ and the third one is in $|y'\rangle$, the angular frequency $\omega_{x,\,ye,\,ee}$ being the $|y\rangle_x-|e\rangle_x$ transition angular frequency of the first one assumed when the second one is in $|e\rangle$ and the third one is in $|e\rangle$;

a control unit configured to control frequencies and intensities of the light beams; and a measuring unit configured to measure intensity of light emitted from or transmitted through the physical system group A(E)' in the thin film A(E) to detect a quantum state of the physical system group A(E)'.

2. The quantum computer according to claim 1, wherein:
the laminated unit has an optical waveguide only in the thin film A(E);
the light source generates two light beams of two angular frequencies $\omega_{A(E),\,ye,\,g}$ and $\omega_{A(E),\,ye,\,e}$ having spectral widths each narrower than a difference between the two angular frequencies, also generates four light beams of four angular frequencies $\omega_{x,\,ye,\,gg}$, $\omega_{x,\,ye,\,ge}$, $\omega_{x,\,ye,\,eg}$ and $\omega_{x,\,ye,\,ee}$ having spectral widths each narrower than differences between the four angular frequencies, and guides the two light beams of the two angular frequencies $\omega_{A(E),\,ye,\,g}$ and $\omega_{A(E),\,ye,\,e}$ into the optical waveguide to operate the physical system group A(E)'; and
the measuring unit measures intensity of light transmitted through the optical waveguide, or intensity of light emitted from the physical system group in the optical waveguide.

3. The quantum computer according to claim 1, wherein the physical systems A'', B'' and C'' are three types of rare-earth ions A''', B''' and C''', the thin films x are formed of oxide single crystal or oxide microcrystal, the energy states $|0\rangle_x$ and $|1\rangle_x$ are nuclear spin states of each rare-earth ion x''' of the rare-earth ions A''', B''' and C''' assumed when each rare-earth ion x''' is in an electron ground state, and the energy state $|e\rangle_x$ is an electron excited state of each rare-earth ion x'''.

4. The quantum computer according to claim 3, wherein in order to select physical systems, used as quantum bits, from a large number of physical systems x'' contained in a first thin film x, the light source and the control unit execute the following:

applying, to the thin films of the laminated unit, the light beam of the angular frequency $\omega_{x,\,ye,\,gg}$ that resonates with a $|y\rangle_x-|e\rangle_x$ transition of each physical system x'' within inhomogeneous broadening, and then applying, to the thin films, a light beam of an angular frequency $\omega_{x,\,ye,\,gg}-\omega_{x,\,01}$ when a physical system x''−1 and a physical system x''+1 are in $|y\rangle_{x-1}$ and $|y'\rangle_{x+1}$, respectively, to mainly include, as a physical system x'' that resonates with the light beam of the angular frequency $\omega_{x,ye,gg}$, physical system that resonates with a $|z\rangle_x-|e\rangle_x$ transition (z=0 if energy of $|1\rangle_x$ is greater than energy of $|0\rangle_x$, and z=1 if the energy of $|1\rangle_x$ is not greater than the energy of $|0\rangle_x$), the physical system x''−1 being contained in a thin film located just below the first thin film x containing the physical system x'', the physical system x''+1 being contained in a thin film located just above the first thin film x, $|a\rangle_x$ representing a state which is not used for expressing quantum bits, $\omega_{x,\,a0}$ representing a $|a\rangle_x-|0\rangle_x$ transition angular frequency, and $\omega_{x,\,01}$ representing a $|0\rangle_x-|1\rangle_x$ transition angular frequency;

then applying a π pulse of an angular frequency $\omega_{B,\,ye,\,gg}$ to the thin films to set the physical system group B' in $|e\rangle_B$, applying, to the thin films, a combination of a π pulse of an angular frequency $\omega_{A,\,re}$ and a π pulse of an angular frequency $\omega_{A,\,re}+\omega_{A,\,ay}$ when energy of $|y\rangle_A$ is higher than energy of $|a\rangle_A$, or a combination of the π pulse of the angular frequency $\omega_{A,\,re}$ and a π pulse of an angular frequency $\omega_{A,\,re}-\omega_{A,\,ay}$ when the energy of $|y\rangle_A$ is lower than the energy of $|a\rangle_A$, while varying a value of $\omega_{A,\,re}$, and again applying the π pulse of an angular frequency $\omega_{B,\,ye,\,gg}$ to the thin films to return the physical system group B' in $|y\rangle_B$, the angular frequency $\omega_{A,\,re}$ falling within a range that excludes an angular frequency range having a width of $\Delta\omega_{A,\,bit}$ and using, as a center of the width of $\Delta\omega_{A,\,bit}$, an angular frequency $\omega_{A,\,ye,\,gg}+\Delta\omega_{A,\,ye,\,ge}$;

then applying a π pulse of an angular frequency $\omega_{C,\,ye,\,gg}$ to the thin films to set the physical system group C' in $|e\rangle_C$, applying, to the thin films, a combination of a π pulse of an angular frequency $\omega_{B,\,re}$ and a π pulse of an angular frequency $\omega_{B,\,re}+\omega_{B,\,ay}$ when energy of $|y\rangle_B$ is higher than energy of $|a\rangle_B$, or a combination of the π pulse of the angular frequency $\omega_{B,\,re}$ and a π pulse of an angular frequency $\omega_{B,\,re}-\omega_{B,\,ay}$ when the energy of $|y\rangle_B$ is lower than the energy of $|a\rangle_B$, while varying a value of $\omega_{B,\,re}$, and again applying the π pulse of an angular frequency $\omega_{C,\,ye,\,gg}$ to the thin films to return the physical system group C' in $|y\rangle_C$, the angular frequency $\omega_{B,\,re}$ falling within a range that excludes an angular frequency range having a width of $\Delta\omega_{B,\,bit}$ and using, as a center of the width of $\Delta\omega_{B,\,bit}$, an angular frequency $\omega_{B,\,ye,\,gg}+\Delta\omega_{B,\,ye,\,ge}$;

then applying a π pulse of an angular frequency $\omega_{A,\,ye,\,gg}$ to the thin films to set the physical system group A' in $|e\rangle_A$, applying, to the thin films, a combination of a π pulse of an angular frequency $\omega_{C,\,re}$ and a π pulse of an angular frequency $\omega_{C,\,re}+\omega_{C,\,ay}$ when energy of $|y\rangle_C$ is higher than energy of $|a\rangle_C$, or a combination of the π pulse of the angular frequency $\omega_{c,\,re}$ and a π pulse of an angular frequency $\omega_{c,\,re}-\omega_{c,\,ay}$ when the energy of $|y\rangle_C$ is lower than the energy of $|a\rangle_c$, while varying a value of $\omega_{c,\,re}$, and again applying the π pulse of an angular frequency $\omega_{A,\,ye,\,gg}$ to the thin films to return the physical system group A' in $|y\rangle_A$, the angular frequency $\omega_{c,\,re}$ falling within a range that excludes an angular frequency range having a width of $\Delta\omega_{C,\,bit}$ and using, as a center of the width of $\Delta\omega_{C,\,bit}$, an angular frequency $\omega_{C,\,ye,\,gg}+\Delta\omega_{C,\,ye,\,ge}$;

and using, at this time as quantum bits, physical system group x' which is set in $|y\rangle_x$ to collectively further bias, to one energy side (a lower or higher energy side), energy corresponding to a transition angular frequency of a physical system group used as a quantum bit and contained in a second thin film included in the thin films, when a physical system group used as another quantum bit and contained in a third thin film included in the thin films and adjacent to the second thin film is in an electron excited state, than in an electron ground state.

5. The quantum computer according to claim 4,
wherein when the physical system x''−1 and the physical system x''+1 (x''=A'', B'', C'') are in $|y\rangle_{x-1}$ and $|y'\rangle_{x+1}$ respectively, the light source and the control unit apply, to the thin films, the light beam of the angular frequency $\omega_{x,\,ye,\,gg}$ that resonates with the $|y\rangle_x-|e\rangle_x$ transition of the physical system x within inhomogeneous broadening, and then apply, to the thin films, a light beam of an angular frequency $\omega_{x,\,ye,\,gg}+\omega_{x,\,01}$, instead of the light beam of the angular frequency $\omega_{x,\,ye,\,gg}-\omega_{x,\,01}$, if x" is one or all of A", B" and C", to cause the physical system x" that resonates with the light beam of the angular frequency $\omega_{x,\,ye,\,gg}$ to include physical systems that resonate with a $|z>_x-|e>_x$ transition.

6. A quantum computing method comprising:
preparing a laminated unit including a plurality of thin films A each containing a physical system group A' formed of a plurality of physical systems A", a plurality of thin films B each containing a physical system group B' formed of a plurality of physical systems B", and a plurality of thin films C each containing a physical system group C' formed of a plurality of physical systems C", the thin films A, B and C being alternately stacked on each other with a thin film A positioned lowest, in an order of A, B, C, A, B, C, A, . . . , each of the physical systems A", B", C", having three different energy states $|0>_x$, $|1>_x$, $|e>_x$ (suffix x indicating a state of each of physical systems x", and x" representing A", B" and C" that represent types of the physical systems, the physical systems x" providing physical system groups x'), a quantum bit being expressed by a quantum mechanical superposition state of $|0>_x$ and $|1>_x$;
generating a plurality of light beams having angular frequencies $\omega_{A(E),\,ye,\,g}$, $\omega_{A(E),\,ye,\,e}$, $\omega_{x,\,ye,\,gg}$, $\omega_{x,\,ye,\,ge}$, $\omega_{x,\,ye,\,eg}$ and $\omega_{x,\,ye,\,ee}$, and having spectral widths narrower than differences between the angular frequencies, and applying the light beams to the thin films, an angular frequency $\omega_{A(E),\,ye,\,g}$ being a $|y>_{A(E)}-|e>_{A(E)}$ (y=0, 1) transition angular frequency of one (physical system group A(E)') of the physical system groups A' that is contained in a lowest one (thin film A(E)) of the thin films A, the $|y>_{A(E)}-|e>_{A(E)}$ transition angular frequency being assumed when one of the physical system groups B' that is contained in one of the thin films B that is located just above the thin film A(E) is in $|y'>_B$ (y'=0, 1), the angular frequency $\omega_{A(E),\,ye,\,e}$ being the $|y>_{A(E)}-|e>_{A(E)}$ transition angular frequency assumed when the one of physical system group B' is in $|e>_B$, an angular frequency $\omega_{x,\,ye,\,gg}$ being a $|y>_x-|e>_x$ transition angular frequency of a first one of the physical system groups x' which excludes the physical system group A(E)', the $|y>_x-|e>_x$ transition angular frequency being assumed when a second one of the physical system groups x' located just below the first one is in $|y>$ and a third one of the physical system groups x' located just above the first one is in $|y'>$, an angular frequency $\omega_{x,\,ye,\,ge}$ being the $|y>_x-|e>_x$ transition angular frequency of the first one assumed when the second one is in $|y>$ and the third one is in $|e>$, the angular frequency $\omega_{x,\,ye,\,eg}$ being the $|y>_x-|e>_x$ transition angular frequency of the first one assumed when the second one is in $|e>$ and the third one is in $|y'>$, the angular frequency $\omega_{x,\,ye,\,ee}$ being the $|y>_x-|e>_x$ transition angular frequency of the first one assumed when the second one is in $|e>$ and the third one is in $|e>$;
applying the light beams to the thin films to operate quantum bits while controlling frequencies and intensities of the light beams; and
applying the light beams to the physical system group A(E)' contained in the thin film A(E), and measuring intensity of light emitted from or transmitted through the physical system group A(E)' to detect a quantum state of the physical system group A(E)' to read a quantum bit.

7. The method according to claim 6, wherein:
the laminated unit has an optical waveguide only in the thin film A(E);
generating the light beams generates two light beams of two angular frequencies $\omega_{A(E),\,ye,\,g}$ and $\omega_{A(E),\,ye,\,e}$ having spectral widths each narrower than a difference between the two angular frequencies, also generates four light beams of four angular frequencies $\omega_{x,\,ye,\,gg}$, $\omega_{x,\,ye,\,ge}$, $\omega_{x,\,ye,\,eg}$ and $\omega_{x,\,ye,\,ee}$ having spectral widths each narrower than differences between the four angular frequencies, and guides the two light beams of the two angular frequencies $\omega_{A(E),\,ye,\,g}$ and $\omega_{A(E),\,ye,\,e}$ into the optical waveguide to operate the physical system group A(E)'; and measuring the intensity of light measures intensity of light transmitted through the optical waveguide, or intensity of light emitted from the physical system group in the optical waveguide.

8. The method according to claim 6, wherein the physical systems A", B" and C" are three types of rare-earth ions A''', B''' and C''', the thin films x are formed of oxide single crystal or oxide microcrystal, the energy states $|0>_x$ and $|1>_x$ are nuclear spin states of each rare-earth ion x''' of the rare-earth ions A''', B''' and C''' assumed when each rare-earth ion x''' is in an electron ground state, and the energy state $|e>_x$ is an electron excited state of each rare-earth ion x'''.

9. The method according to claim 8, wherein in order to select physical systems, used as quantum bits, from a large number of physical systems x" contained in a first thin film x, generating the light beams and controlling frequencies and intensities of the light beams execute the following:
applying, to the thin films of the laminated unit, the light beam of the angular frequency $\omega_{x,\,ye,\,gg}$ that resonates with a $|y>_x-|e>_x$ transition of each physical system x" within inhomogeneous broadening, and then applying, to the thin films, a light beam of an angular frequency $\omega_{x,\,ye,\,gg}-\omega_{x,\,01}$ when a physical system x"−1 and a physical system x"+1 are in $|y>_{x-1}$ and $|y'>_{x+1}$, respectively, to mainly include, as a physical system x" that resonates with the light beam of the angular frequency $\omega_{x,\,ye,\,gg}$, a physical system that resonates with a $|z>_x-|e>_x$ transition (z=0 if energy of $|1>_x$ is greater than energy of $|0>_x$, and z=1 if the energy of $|1>_x$ is not greater than the energy of $|0>x$), the physical system x"−1 being contained in a thin film located just below the first thin film x containing the physical system x", the physical system x"+1 being contained in a thin film located just above the first thin film x, $|a>_x$ representing a state which is not used for expressing quantum bits, $\omega_{x,\,a0}$ representing a $|a>_x-|0>_x$ transition angular frequency, and $\omega_{x,\,01}$ representing a $|0>_x-|1>_x$ transition angular frequency;
then applying a π pulse of an angular frequency $\omega_{B,\,ye,\,gg}$ to the thin films to set the physical system group B in $|e>_B$, applying, to the thin films, a combination of a π pulse of an angular frequency $\omega_{A,\,re}$ and a π pulse of an angular frequency $\omega_{A,\,re}+\omega_{A,\,ay}$ when energy of $|y>_A$ is higher than energy of $|a>_A$, or a combination of the π pulse of the angular frequency $\omega_{A,\,re}$ and a π pulse of an angular frequency $\omega_{A,\,re}-\omega_{A,\,ay}$ when the energy of $|y>_A$ is lower than the energy of $|a>_A$, while varying a value of $\omega_{A,\,re}$, and again applying the π pulse of an angular frequency $\omega_{B,\,ye,\,gg}$ to the thin films to return the physical system group B' in $|y>_B$, the angular frequency $\omega_{A,\,re}$ falling within a range that excludes an angular frequency range having a width of $\Delta\omega_{A,\,bit}$ and using, as a center of the width of $\Delta\omega_{A,\,bit}$, an angular frequency $\omega_{A,\,ye,\,gg}+\Delta\omega_{A,\,ye,\,ge}$;
then applying a π pulse of an angular frequency $\omega_{C,\,ye,\,gg}$ to the thin films to set the physical system group C' in $|e>_C$, applying, to the thin films, a combination of a π pulse of an angular frequency $\omega_{B,re}$ and a π pulse of an angular frequency $(\omega_{B,re}+\omega_{B,ay}$ when energy of $|y>_B$ is higher than energy of $|a>_B$, or a combination of the π pulse of the angular frequency $\omega_{B,re}$ and a π pulse of an angular frequency $\omega_{B,re}-\omega_{B,ay}$ when the energy of $|y>_B$ is lower than the energy of $|a>_B$, while varying a value of $\omega_{B,re}$, and again applying the π pulse of an angular frequency $\omega_{C,ye,gg}$ to the thin films to return the physical system group C' in $|y>_C$, the angular frequency $\omega_{B,re}$ falling within a range that excludes an angular frequency range having a width of $\Delta\omega_{B,bit}$ and using, as a center of the width of $\Delta\omega_{B,bit}$, an angular frequency $\omega_{B,ye,gg}+\Delta\omega_{B,ye,ge}$;

then applying a π pulse of an angular frequency $\omega_{A,ye,gg}$ to the thin films to set the physical system group A' in $|e>_A$, applying, to the thin films, a combination of a π pulse of an angular frequency $\omega_{C,re}$ and a π pulse of an angular frequency $\omega_{C,re}+\omega_{C,ay}$ when energy of $|y>_C$ is higher than energy of $|a>_c$, or a combination of the π pulse of the angular frequency $\omega_{c,re}$ and a π pulse of an angular frequency $\omega_{c,re}-\omega_{c,ay}$ when the energy of $|y>_c$ is lower than the energy of $|a>_c$, while varying a value of $\omega_{c,re}$, and again applying the π pulse of an angular frequency $\omega_{A,ye,gg}$ to the thin films to return the physical system group A' in $|y>_A$, the angular frequency $\omega_{C,re}$ falling within a range that excludes an angular frequency range having a width of $\Delta\omega_{C,bit}$ and using, as a center of the width of $\Delta\omega_{C,bit}$, an angular frequency $\omega_{C,ye,gg}+\Delta\omega_{C,ye,ge}$;

and using, at this time as quantum bits, the physical system group x' which is set in $|y>_x$ to collectively further bias, to one energy side (a lower or higher energy side), energy corresponding to a transition angular frequency of a physical system group used as a quantum bit and contained in a second thin film included in the thin films, when a physical system group used as another quantum bit and contained in a third thin film included in the thin films and adjacent to the second thin film is in an electron excited state, than in an electron ground state.

10. The method according to claim 9, wherein when the physical system x"−1 and the physical system x"+1 (x"=A", B", C") are in $|y>_{x-1}$ and $|y'>_{x+1}$ respectively, generating the light beams and controlling frequencies and intensities of the light beams apply, to the thin films, the light beam of the angular frequency $\omega_{x,ye,gg}$ that resonates with the $|y>_x-|e>_x$ transition of the physical system x" within inhomogeneous broadening, and then apply, to the thin films, a light beam of an angular frequency $\omega_{x,ye,gg}+\omega_{x,01}$, instead of the light beam of the angular frequency $\omega_{x,ye,gg}-\omega_{x,01}$, if x" is one or all of A", B" and C", to cause the physical system x" that resonates with the light beam of the angular frequency $\omega_{x,ye,gg}$ to include physical systems that resonate with a $|z>_x-|e>_x$ transition.

\* \* \* \* \*